United States Patent
Kurd et al.

(10) Patent No.: US 7,133,751 B2
(45) Date of Patent: Nov. 7, 2006

(54) METHOD AND APPARATUS FOR DETECTING ON-DIE VOLTAGE VARIATIONS

(75) Inventors: Nasser A. Kurd, Portland, OR (US); Javed S. Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/110,224

(22) Filed: Apr. 19, 2005

(65) Prior Publication Data

US 2005/0184764 A1    Aug. 25, 2005

Related U.S. Application Data

(62) Division of application No. 10/394,938, filed on Mar. 21, 2003, now Pat. No. 6,882,238.

(51) Int. Cl.
*G05D 17/00* (2006.01)
(52) U.S. Cl. ............. 700/293; 331/186; 331/185; 331/57; 327/37; 327/74
(58) Field of Classification Search ............ 700/293; 331/186, 57
See application file for complete search history.

(56) References Cited

U.S. PATENT DOCUMENTS

| 4,149,386 | A | 4/1979 | Luongo et al. |
| 4,510,461 | A | 4/1985 | Dickes et al. |
| 5,877,656 | A | 3/1999 | Mann et al. |
| 5,889,440 | A | 3/1999 | Kowshik |
| 6,157,265 | A | 12/2000 | Hanjani |
| 6,160,755 | A | 12/2000 | Norman et al. |
| 6,177,845 | B1 | 1/2001 | Moll |
| 6,348,798 | B1 * | 2/2002 | Daw .................. 324/426 |
| 6,893,153 | B1 * | 5/2005 | Hoffer et al. ........... 374/152 |
| 2003/0204347 | A1 * | 10/2003 | Smith ............... 702/82 |

FOREIGN PATENT DOCUMENTS

| EP | 1 223 493 A1 | 7/2002 |
| JP | 09146654 | 6/1997 |

* cited by examiner

*Primary Examiner*—Joseph Chang
(74) *Attorney, Agent, or Firm*—Cynthia Thomas Faatz

(57) ABSTRACT

On-die voltage and/or frequency detectors. For one aspect, an adaptive frequency clock generation circuit includes a droop detector to detect a supply voltage level and to cause the frequency of an on-die clock signal to be adjusted accordingly.

5 Claims, 8 Drawing Sheets

METHOD AND APPARATUS FOR DETECTING ON-DIE VOLTAGE VARIATIONS

CROSS-REFERENCE TO RELATED APPLICATION

The present application is a divisional application of and claims the priority date of Ser. No. 10/394,938, now U.S. Pat. No. 6,882,238 entitled "A METHOD AND APPARATUS FOR DETECTING ON-DIE VOLTAGE VARIATIONS," filed Mar. 21, 2003 and assigned to the assignee of the present invention.

BACKGROUND

An embodiment of the present invention relates to the field of integrated circuits and, more particularly, to detecting on-die temperature and/or voltage variations.

In high-frequency integrated circuits, such as microprocessors, variations in voltage and/or temperature may result in frequency degradation. Currently, costly resources may be dedicated to, for example, managing voltage variations to avoid such degradation.

In some cases, to prevent functional failures, a voltage margin is added to a supply voltage such that, for maximum supply voltage droops, the operating frequency of the integrated circuit is still maintained. This approach, however, may result in significant power increases for much of the time the integrated circuit device is operating, even though the voltage droops that are being compensated for may occur only infrequently.

As integrated circuit device operating frequencies continue to increase, droop magnitude as a percentage of supply voltage also continues to increase. For some integrated circuits, it may not be possible to provide the necessary voltage margin to protect against voltage droop due to power and cost limitations, for example.

BRIEF DESCRIPTION OF THE DRAWINGS

Embodiments of the present invention are illustrated by way of example and not limitation in the figures of the accompanying drawings in which like references indicate similar elements, and in which.

DETAILED DESCRIPTION

A method and apparatus for digitally detecting voltage and/or temperature variations on an integrated circuit die are described. In the following description, particular types of integrated circuits, circuit configurations, system configurations, etc. are described for purposes of illustration. It will be appreciated, however, that other embodiments are applicable to other types of integrated circuits, circuit configurations and/or system configurations.

For one embodiment, a detector to detect one of a temperature or a voltage level receives a first substantially fixed voltage and outputs a code signal responsive to the detected temperature or level of a second voltage. A control circuit determines a frequency of a clock signal in response to the code signal. Such a detector may be used, for example, in an adaptive frequency clock generation circuit to determine the output frequency as described below in reference to FIG. 1, for example. Further details of these and other embodiments are provided in the description that follows.

Figure 1:
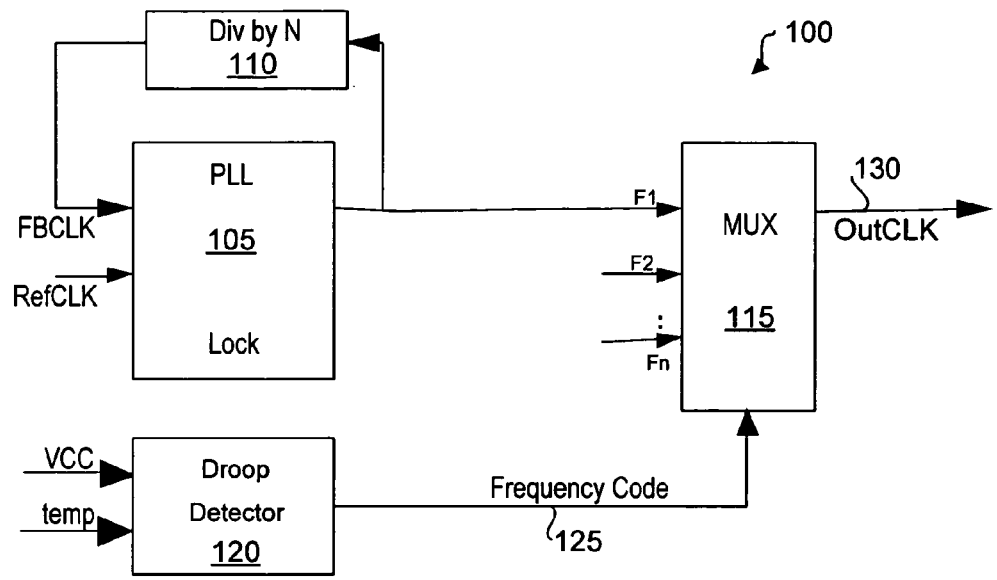
FIG. 1 is a high-level block diagram of an adaptive frequency clocking system of one embodiment.

FIG. 1 is a high-level block diagram of an adaptive frequency clock generation circuit 100 according to one embodiment. As described in more detail below, such a circuit may be used to provide an adaptive clocking approach for a microprocessor or other integrated circuit device for which high-frequency operation is desired.

The adaptive frequency clock generation circuit 100 includes a synchronous clock generator (phase-locked loop (PLL)) 105, a divide-by-N circuit 110, a multiplexer (mux) 115, and a voltage droop (and/or temperature) detector 120. In operation, the PLL 105 receives a reference clock signal (RefCLK) at an input and, in conjunction with the divide-by-N circuit 110, which produces a feedback clock signal (FBCLK), provides a higher frequency output clock signal having a first frequency F1. It will be appreciated that the value of N in the divide-by-N circuit 110 may be any one of a variety of values depending on the desired ratio of the frequency F1 to the frequency of the reference clock signal RefCLK.

Other clock generators (not shown), either alone or in conjunction with a clock dividing or multiplying circuit (not shown), operate in a similar manner to produce clock signals having different frequencies, e.g. F2 . . . Fn as shown in FIG. 1.

Concurrently, the droop detector 120 receives input signal(s) indicating a voltage level of interest, e.g. Vcc and/or a temperature indicator of interest. The Vcc input signal may be received from a voltage supply, while the temperature-related input signal may be received from, for example, on-die temperature sensors. Based on the input signal(s) received, the droop detector 120 provides a frequency code 125 or other control signal to cause the mux 115 to selectively output a clock signal OutCLK at an output 130 having one of the frequencies F1 . . . Fn. The selected clock signal OutCLK may be used to clock core circuitry, for example, on a host integrated circuit that includes the adaptive frequency clocking circuit 100.

Each of the PLL 105, the divide-by-N circuit 110 and mux 115 may be implemented using any one of a variety of known PLL, divide-by-N and/or mux designs depending on a range of factors including, for example, the desired characteristics of the output clock signal OutCLK and the process on which the host integrated circuit is manufactured.

Figure 2:
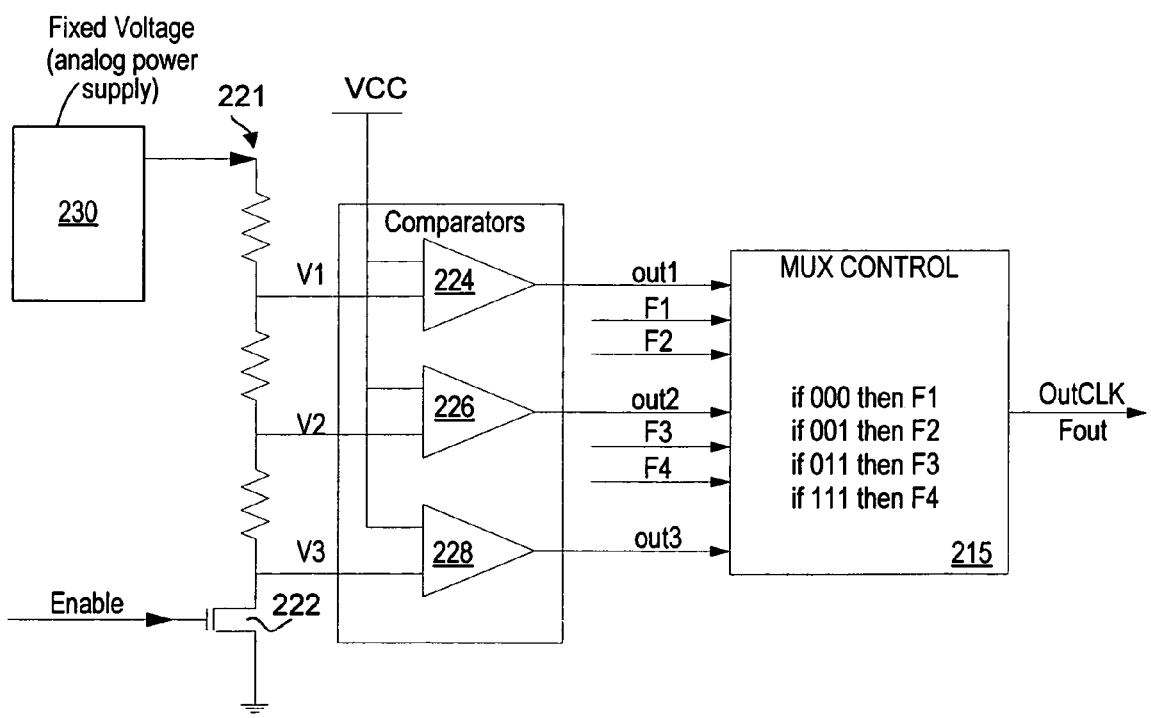
FIG. 2 is a schematic and block diagram of a droop (voltage) detector of one embodiment that may be used in the adaptive frequency clocking system of FIG. 1.

For one embodiment, the droop detector 120 and mux 115 of FIG. 1 may be implemented using the droop detector 220 and control and mux circuit 215 of FIG. 2, for example. The droop detector 220 includes a voltage divider 221 formed by series-coupled resistors R1, R2 and R3, each of which may be implemented, for example, as poly, n-well or p-type metal oxide semiconductor (PMOS) resistors. The type of resistors to be used may be determined based on factors such as, for example, the desired accuracy of the voltage divider, available area, and desired complexity. Where one or more of the resistors R1, R2 and/or R3 is implemented using PMOS devices, the PMOS devices may be sized to reduce the effects of on-die variations.

The droop detector 220 also includes an enable device 222 for one embodiment and comparators 224, 226 and 228, which may be implemented using any one of a variety of well-known comparator designs to provide the functionality described below.

In operation, the voltage divider 221 receives a substantially fixed reference voltage from, for example, a fixed analog power supply 230. The fixed analog power supply 230 may also be used as a supply for other circuitry on the host integrated circuit chip, such as one or more PLLs, for example, such that an additional power supply does not need to be provided for the droop detector 220.

As an enable signal received at an input of the enable device 222 transitions high, the enable device 222, and thus, the droop detector 221, is turned on. The enable signal may be generated by other on-chip circuitry (not shown) or may be received from an external source.

The comparators 224, 226 and 228 each receive a digital supply voltage Vcc that is also provided to other surrounding circuitry. For this embodiment, Vcc is the voltage to be monitored by the droop detector 220. In response to the droop detector 220 being enabled, the comparators 224, 226 and 228 compare Vcc to the reference voltages V1, V2 and V3, respectively.

For one embodiment, the circuit 220 may be designed such that Vcc>V1>V2>V3. As Vcc droops, if it drops below the first reference voltage V1, the output out1 of the comparator 224 is asserted. If Vcc droops further, such that it is below the second reference voltage V2, then the output signal out2 is also asserted and, if Vcc droops below the third reference voltage V3, then the output signal out3 is also asserted.

The output signals out1, out2 and out3 are provided as select or control signals to the control and mux circuit 215 and may correspond to the frequency code signal of FIG. 1 for embodiments for which the detector 220 is used in an adaptive frequency clocking application. Based on the values of the select signals out1, out2 and out3, the mux 215 selects, for the exemplary embodiment of FIG. 2, one of the input signals having frequencies F1, F2, F3 and F4 as shown to provide the output signal OutCLK having a frequency Fout. The signals having frequencies F1, F2, F3 and F4 may be generated as described above in reference to FIG. 1. For this exemplary embodiment, the frequency of the OutCLK signal may be selected according to Table 1, for example:

TABLE 1

| out3 | out2 | out1 | Fout |
|------|------|------|------|
| 0 | 0 | 0 | F1 |
| 0 | 0 | 1 | F2 |
| 0 | 1 | 1 | F3 |
| 1 | 1 | 1 | F4 |

The target values of the reference voltages V1, V2 and V3 and thus, the selected values of the resistors R1, R2 and R3 and current through the enable device 222 are dependent upon the targeted trip points at which the circuit designer desires to cause the frequency of the output clock signal to be adjusted. The desired trip points depend upon factors such as, for example, the specified value for Vcc, expected voltage droop, design margins and other considerations that will be appreciated by those of ordinary skill in the art.

The current through the voltage divider 221 and thus, the magnitudes of voltages V1, V2 and V3 at outputs of the voltage divider 221, is determined by the current through the enable device 222. To change the voltages V1, V2 and V3, for one embodiment, the current may be digitally programmed to adjust the values of the voltage references depending upon the ratio of the resistances R1, R2 and R3. The current may be changed by effectively changing the size of the enable transistor 222. This may be achieved, for example, by constructing device 222 from parallel NMOS transistors, each with a separate enable. The current is adjusted by manipulating the assertion one or more of these enables in a manner well-known to those of ordinary skill in the art.

For one embodiment, the values of one or more of the reference voltages V1, V2 and/or V3 may alternatively or additionally be manipulated after manufacture by adjusting one or more of the resistances R1, R2 and/or R3. For example, where the resistors R1, R2 and/or R3 are implemented as PMOS resistors, the values of the resistances can be adjusted by simply legging these PMOS devices (implement as smaller but parallel transistors instead of one big transistor) and connecting or disconnecting the different legs (via metal only) to manipulate the actual device size and thus the resistance.

It will be appreciated that, while three reference voltages are used in the droop detector of FIG. 2 to select between four different signal frequencies, for another embodiment, a different number of reference voltages may be provided and used in a similar manner to select between a different number of output signal frequencies. Further, while a voltage divider receiving a fixed voltage from an analog power supply is used to provide the reference voltages for the circuit of FIG. 2, other approaches, such as using bandgaps to generate the reference voltages, may be used for other embodiments.

Further, while the detector 220 detects variations in a supply voltage Vcc, a detector with a similar configuration may alternatively be used to detect changes in temperature. For such an embodiment, reference and variable signals associated with temperature are compared in a similar manner to select an output signal frequency.

Figure 3:
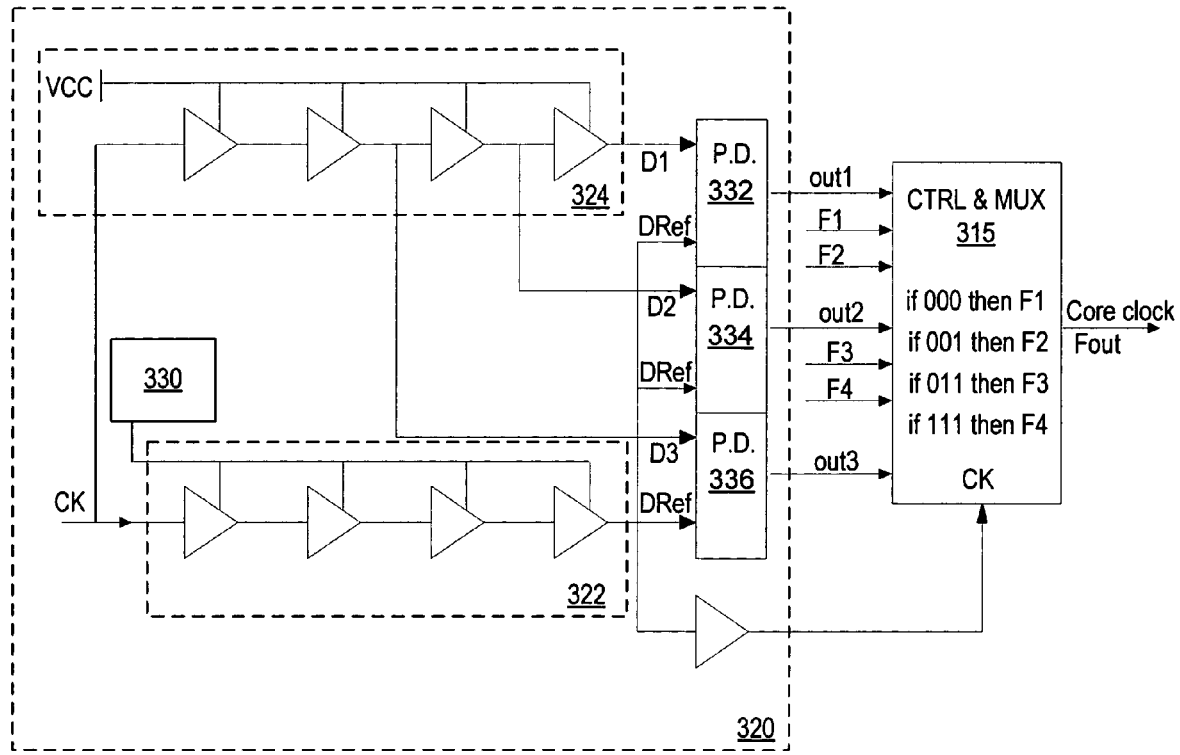
FIG. 3 is schematic and block diagram of a voltage detector of another embodiment that may be used in the adaptive frequency clocking system of FIG. 1.

A voltage droop detector 320 and associated mux 315 of another embodiment that may be used, for example, to provide the detector 120 and mux 115 of FIG. 1 are shown in FIG. 3. For the embodiment shown in FIG. 3, the droop detector 320 includes a first chain of delay elements 322 that is powered by a fixed supply voltage from a fixed power supply 330 and a second chain of delay elements 324 that receives a supply voltage Vcc from a digital power supply. For this embodiment, the supply voltage Vcc is to be monitored by the droop detector 320 and the fixed power supply may, as described above, be an analog power supply that is used to power other circuitry on the same integrated circuit. The detector 320 of one embodiment also includes phase detectors 332, 334 and 336 and a buffer 338 each of which may be implemented using known designs for such circuits that provide the associated features described herein.

The first chain of delay elements 322 that receives the fixed supply voltage from the fixed supply 330 provides, for an input signal CK, a reference path delay Dref that is not sensitive to variations in a digital power supply. In contrast, the delay through the second chain of delay elements 324 varies depending upon the magnitude of Vcc.

For one embodiment, a tap in the middle of the chain of delay elements 324 provides a first delayed signal having a delay D3, a tap after the third delay element in the chain of delay elements 324 provides a second delayed signal having a delay D2 and an output of the chain 324 provides a third delayed signal having a delay D1. The detector 320 of one embodiment may be designed such that Dref>D1>D2>D3.

In operation, the input signal CK is concurrently injected into the delay paths 322 and 324. Each of the phase detectors 332, 334 and 336 then detects whether the output of the reference delay path 322 leads or lags the outputs of the other delay path 324 and provides a corresponding output signal out1, out2 or out3, respectively. For example, if Vcc droops to the extent that the delay D1 exceeds Dref, the output signal out1 from the phase detector 332 is asserted. If Vcc droops such that one or both of the delays D2 and/or D3 exceed Dref, the corresponding output signals out2 and/or out3 are asserted.

The output signals out1, out2 and out3 are provided as select signals to a mux and control circuit 315, which receives signals having frequencies F1, F2, F3 and F4. The circuit 315 may be similar in configuration and operation to the mux and control circuit 215 described above except that the circuit 315 of one embodiment further includes flip-flops (not shown) to sample the output signals from the phase detectors 332, 334 and 336 after they are asserted in order to capture their values before the clock signal transitions to a low state. Further, for one embodiment, the mux 315 selects the output signal having a frequency Fout according to Table 1 presented above.

It will be appreciated that, while the circuit 320 uses three different delays to select between four signal frequencies, for another embodiment, a different number of delays may be used and/or signal frequencies selected in a similar manner.

Figure 4:
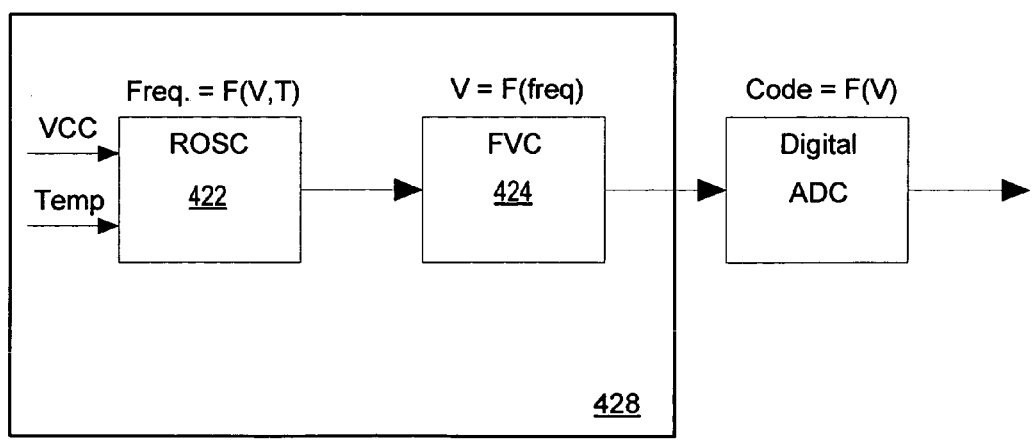
FIG. 4 is a block diagram of a droop/voltage detector of one embodiment that may be used in the adaptive frequency clock generation circuit of FIG. 1.

Referring now to FIG. 4, a high-level block diagram of an all-digital detector 420 of yet another embodiment is illustrated. The detector 420 may be used to provide the detector 120 of FIG. 1 for an adaptive frequency clocking system for one embodiment. For another embodiment, the detector 420 may be used, for example, as part of a droop history circuit. As shown, the detector 420 includes a ring oscillator (ROSC) 422, a frequency-to-voltage converter (FVC) 424 and a digital analog-to-digital converter (DADC) 426.

At a high level, the ring oscillator 422 generates an output signal having a frequency that is proportional to voltage and temperature, which is provided to the FVC 424 as shown. The frequency-to-voltage converter 424 then generates an output signal having a voltage that is proportional to the frequency of the input signal received from the ROSC 422. The ROSC 422 and FVC 424 work together in this manner as a voltage/temperature amplifier and level shifter 428 that magnifies the voltage/temperature effect on the circuitry and positions the voltage of the resulting output signal at a level that, for one embodiment, is substantially in the midrange of the capabilities of the DADC 426 as described in more detail below.

Figure 6:
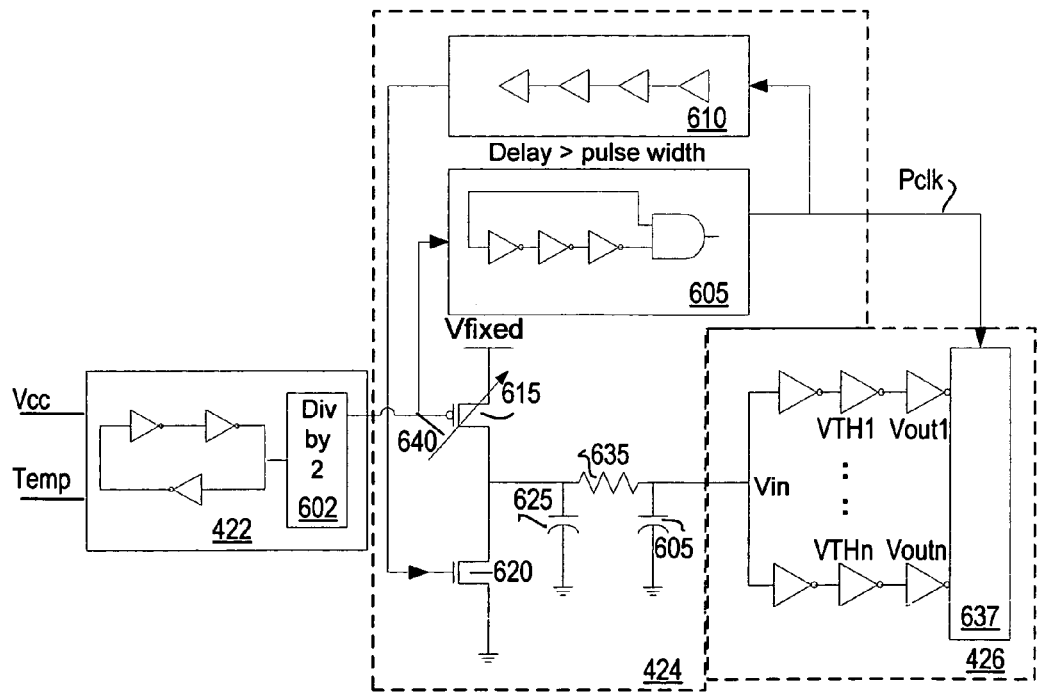
FIG. 6 is a schematic diagram showing the droop/voltage detector of FIG. 4 in more detail.

In response to receiving the output signal from the FVC 424, the DADC 426 then provides an output code signal that is proportional to temperature and voltage as described in more detail in reference to FIG. 6. The latency of the detector 420 for one embodiment is two clock cycles, but may be different for other embodiments.

Figure 5:
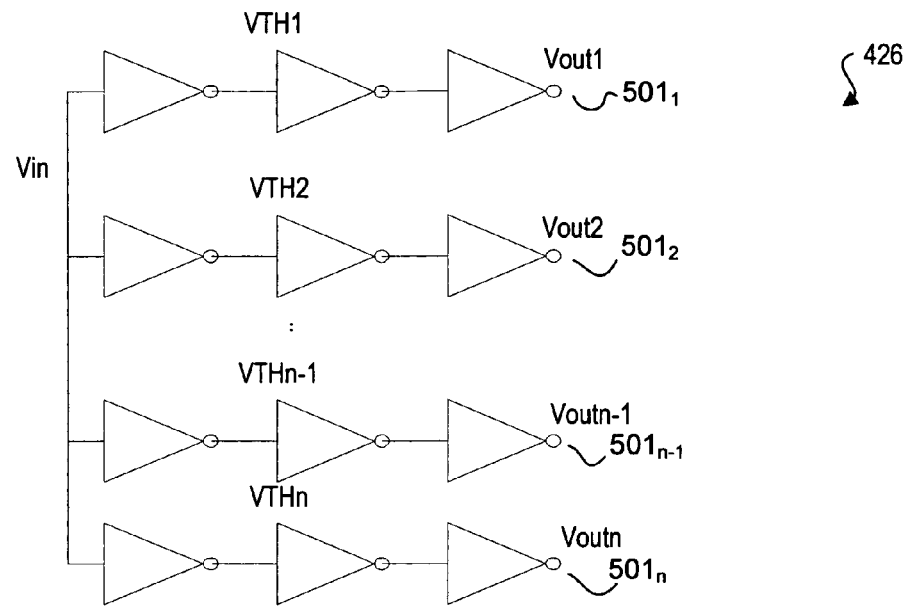
FIG. 5 is a schematic diagram of a digital analog to digital converter of one embodiment that may be used in the droop/voltage detector of FIG. 4.

FIG. 5 is a schematic diagram showing the all-digital analog-to-digital converter 426 of one embodiment in more detail. The DADC 426 includes n chains 501 of serially connected inverters, each of the n chains for this embodiment including three inverters. Each of the n chains of serially connected inverters may alternately be referred to herein as an inverter sensor 501.

Each of the n inverter sensors 501 shown in FIG. 5 is designed to have a different switching threshold voltage Vth shown as Vth1 through Vthn and provides a corresponding output signal Vout1 through Voutn, respectively. The threshold voltage is varied for each of the inverter sensors 501 through careful selection of relative p and n transistor device sizes as is well known in the art and as shown in the equations below.

$$\beta n = \frac{\mu n \varepsilon}{tox} \frac{W}{L}$$

$$\beta p = \frac{\mu p \varepsilon}{tox} \frac{W}{L}$$

$$Vth = \frac{VDD + Vtp + Vtn \cdot \sqrt{\frac{\beta n}{\beta p}}}{1 + \sqrt{\frac{\beta n}{\beta p}}},$$

where μ is the electron mobility (either p or n as indicated, ε is the permittivity of the respective gate insulator, tox is the thickness of the oxide, W is the respective transistor width, L is the respective transistor length, Vth is the switching threshold voltage, Vtn is the threshold voltage of the NMOS transistor and Vtp is the threshold voltage of the PMOS transistor.

In order to reduce or minimize the effects of any device or voltage variation effects on the Vth of the inverter sensors 501, a stable power supply, such as the fixed voltage supply described above, may be used for the DADC 426. Further, careful device sizing for each of the inverters may also be practiced to reduce Vth variation in a well-known manner.

The number of inverter sensors used to provide the DADC 426, and the desired switching thresholds for each depends on the desired accuracy for the DADC 426 and the expected range of variation in the signal to be monitored. The larger the number of inverter sensors used, the higher the accuracy. Because Vin is being sensed by manipulating the switching threshold voltage of inverter sensors, increasing the number of the inverter sensors, each tuned for finer switching threshold, results in higher resolution and thus accuracy in the detection.

FIG. 6 is a schematic diagram showing the detector 420 of FIG. 4 in more detail. As shown, for one embodiment, the ROSC 422 includes or has an output coupled to a divide-by-2 circuit 602. The frequency-to-voltage converter (FVC) 424 includes a pulse generator 605 a feedback delay path 610, a p-type charging transistor 615, an n-type discharge transistor 620, and an RC path including capacitors 625 and 630 and a resistor 635 coupled as shown in FIG. 6. For one embodiment, the charging transistor 615 has one terminal coupled to receive a fixed power supply voltage $V_{FIXED}$ such as from an analog clean power supply as described above in reference to other embodiments.

In operation, the ROSC 422 generates a clock signal having a frequency that is proportional to temperature and to the supply voltage for the ROSC 422 as described above. The ROSC 422 is responsive to both temperature and voltage variations, but since the voltage varies much faster than temperature, the ROSC 422 primarily reacts to changes in voltage. This is particularly true in a controlled test environment in which temperature is controlled by test equipment.

The clock signal is divided by two by the divide-by-two circuit 602 to provide a signal divCLK on the line 640. As the divCLK signal transitions low, the charging transistor 615 is enabled causing the node Vin to be charged. The final voltage Vin achieved while the charging transistor is enabled is proportional to I*T/C where I is the charging transistor 615 current, T is the clock period of the divCLK signal and C is the total capacitance of the node Vin.

As the divCLK signal transitions high, the charging transistor is disabled. The value of Vin determines the output of the DADC 426 as described above, which is then sampled into latches 637 using a pulsed clock signal pclk that is generated by the pulse generator 605. The latched output code represents a voltage and/or temperature value and may be used, for example to adjust a signal frequency in an adaptive frequency clocking system as shown in FIG. 1 or stored in droop history registers to indicate a voltage droop level as described below in reference to FIG. 7.

With continuing reference to FIG. 6, a delayed version of the pclk signal is provided by delay element 610 to the discharging transistor 620. In response to being enabled, the discharge transistor 620 discharges the node Vin in preparation for the next monitoring cycle.

As will be appreciated by those of ordinary skill in the art, the charge at the node Vin is a function of the frequency of the signal that controls charging and discharging. For one embodiment, a calibration operation is performed to identify a frequency for which the charge Vin results in an output code from the DADC 426 that is substantially in the midrange of the output capabilities of the DADC 426 as described in more detail below.

Figure 16:
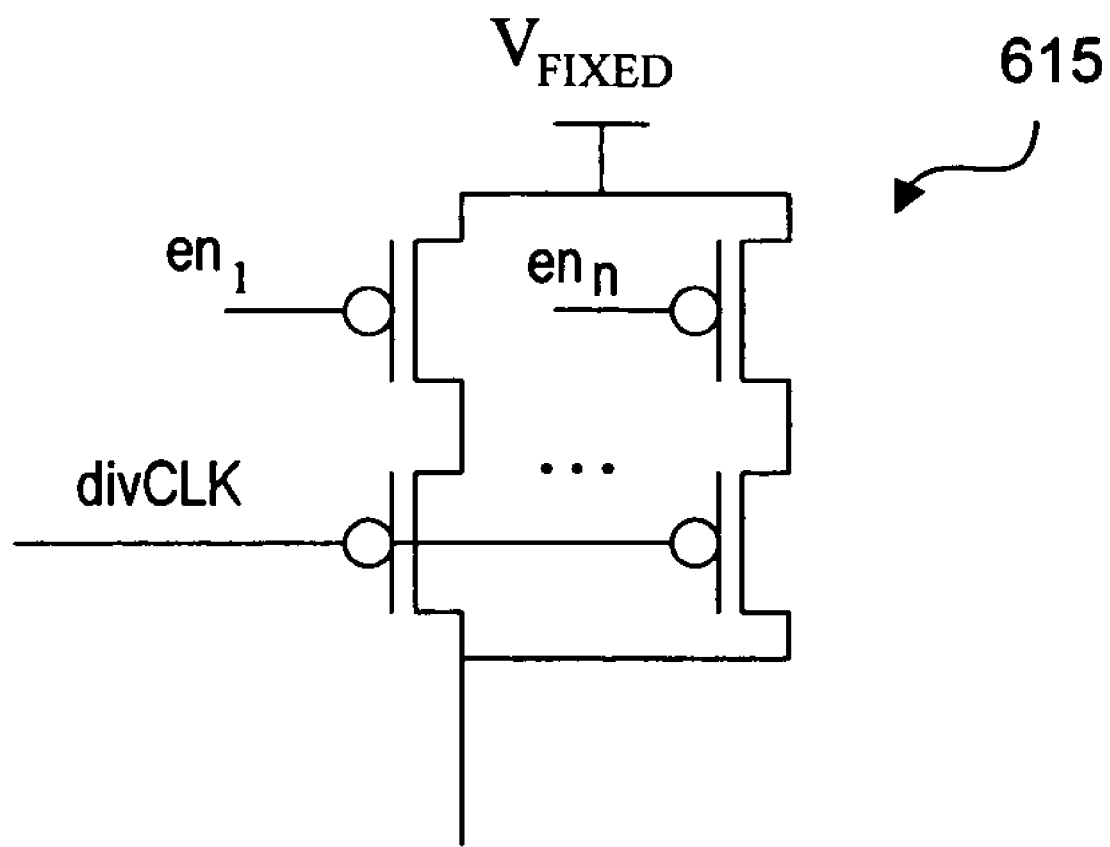
FIG. 16 is a schematic diagram of an exemplary implementation for a charging transistor that may be advantageously used in the embodiment of FIG. 6.

For some embodiments, the charging transistor 615 is an adjustable charge transistor to provide for initial setting of the latches. An exemplary implementation for the charging transistor 615 that may be used for one embodiment is shown in FIG. 16. The strength of the transistor 615 can be increased in this implementation by increasing the number of enable signals $en_1 \ldots en_n$ that are asserted.

The calibration operation mentioned above may be performed, for example, a few cycles after de-asserting the reset signal. For one embodiment, the calibration flow as follows: 1) the voltage Vcc is sensed and the result monitored by scanning out the code output by the DADC 426 (using, for example a Test Access Port (TAP)-related pin (not shown) pin in conjunction with a scan chain); 2) the strength of the PMOS device 615 is adjusted by increasing or decreasing the number of enabled PMOS transistors based on the scanned out data; and 3) 1 and 2 are repeated until the code is in the midrange.

While a specific all-digital analog-to-digital converter configuration is described above, for other embodiments, a different type of analog-to-digital converter, including an analog to digital converter with some analog circuitry, may be used instead.

Figure 7:
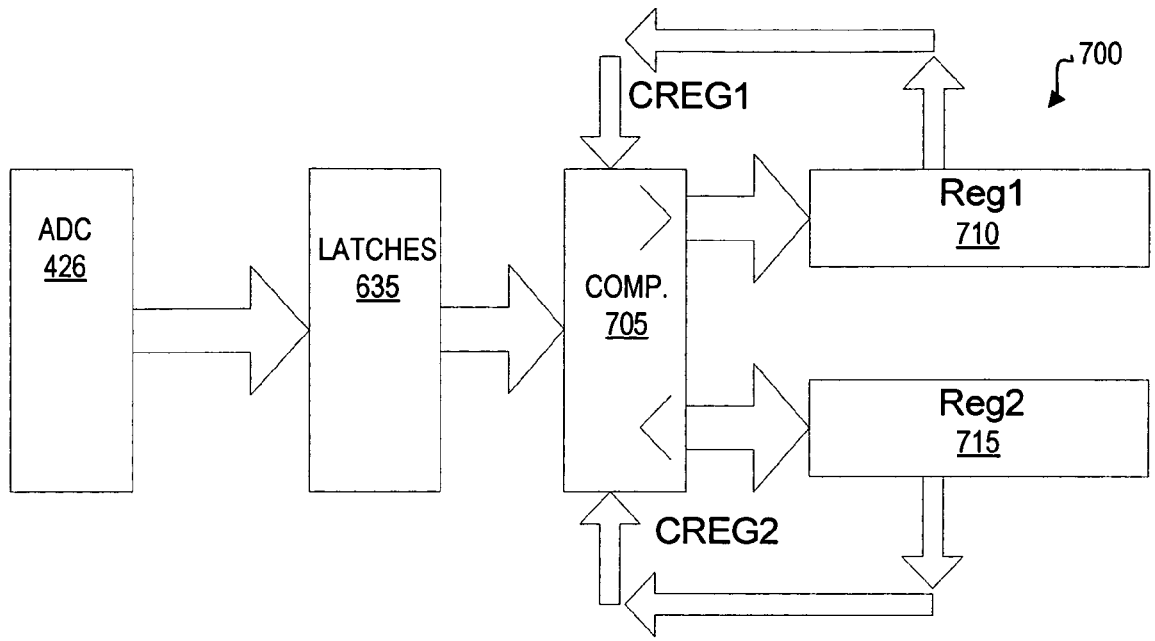
FIG. 7 is a block diagram showing another application for the droop detector of FIG. 6 to track droop history.

FIG. 7 is a block diagram of a circuit 700 that may use the droop detector of FIGS. 4–6 to provide droop history. The circuit 700 includes a comparator 705 and droop history registers 710 and 715. For one embodiment, the droop history register 710 may be initialized to all 0s and the droop history register 715 may be initialized to all 1s.

In operation, the comparator 705 receives the code latched from the DADC 426 and compares it to the values stored in the droop history registers 710 and 715. If the code is greater than the value stored in the register 710, the register 710 is updated to the new value. If the code is less than the value stored in the register 715, the register 715 is updated to the new value. In this manner, a history of the highest and lowest voltage levels can be tracked. It will be appreciated that other applications for the droop detectors of various embodiments are within the scope of various embodiments.

Figure 8:
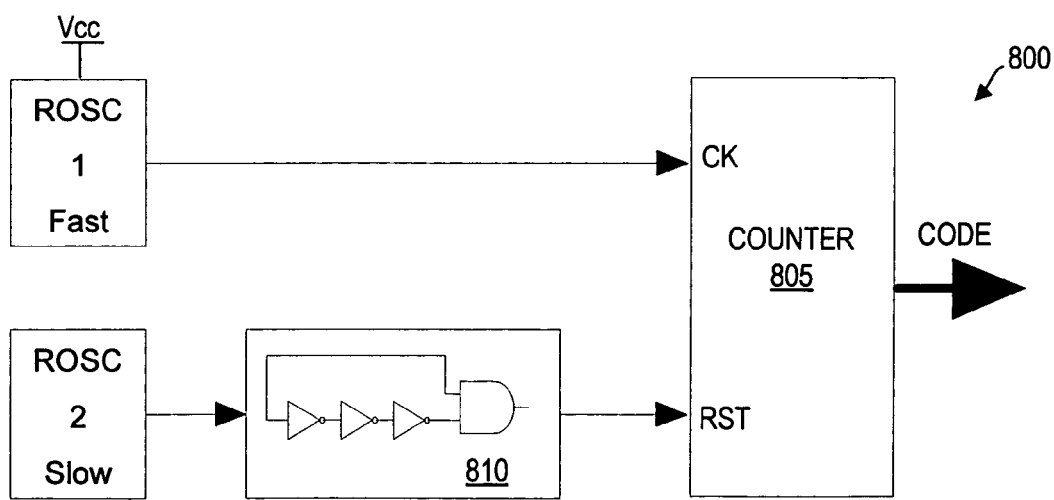
FIG. 8 is a schematic and block diagram of a droop detector of another embodiment that may be used, for example, for droop monitoring.

FIG. 8 is a block diagram of a droop detector 800 of another embodiment. The droop detector 800 may be used, for example, as a droop monitor in the circuit 1100 of FIG. 11. Other applications for the droop detector 800 are within the scope of various embodiments.

The droop detector 800 includes two ring oscillators ROSC1 and ROSC2, where ROSC1 (fast) provides a higher frequency signal than ROSC2 (slow). The droop detector 800 also includes a counter 805 and a pulse generator 810.

Figure 9:
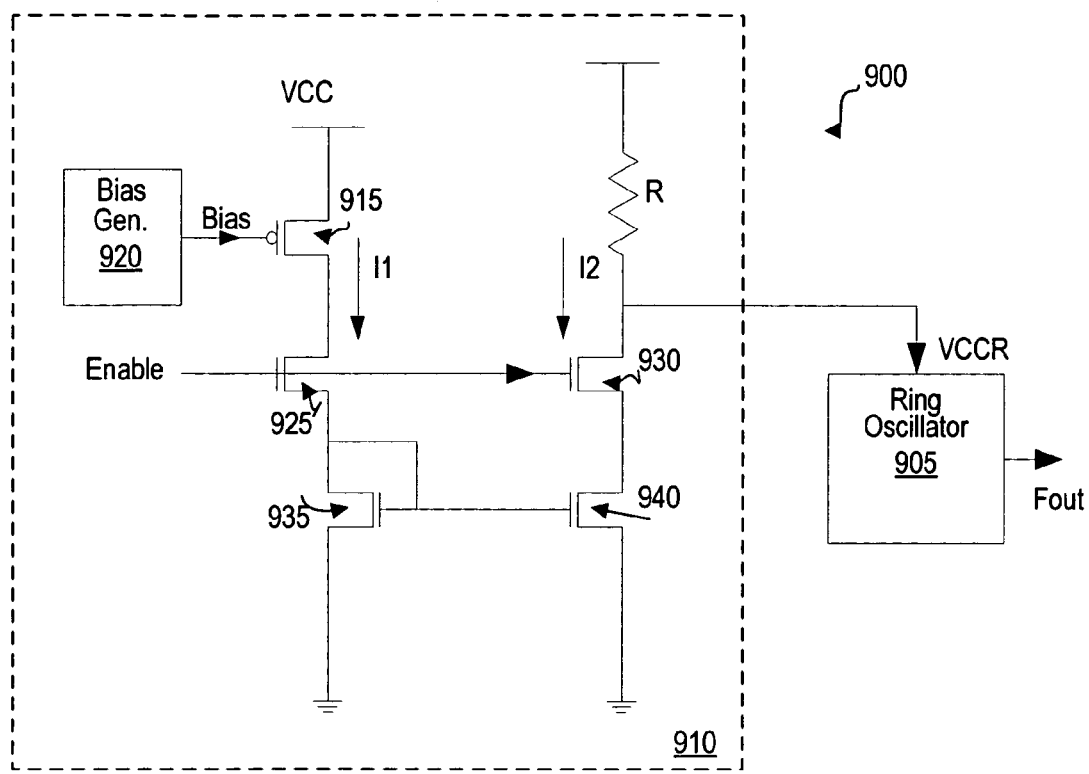
FIG. 9 is a schematic and block diagram of a reversed voltage sensitivity circuit that may be used to control a ring oscillator in the droop detector of FIG. 8.
Figure 10:
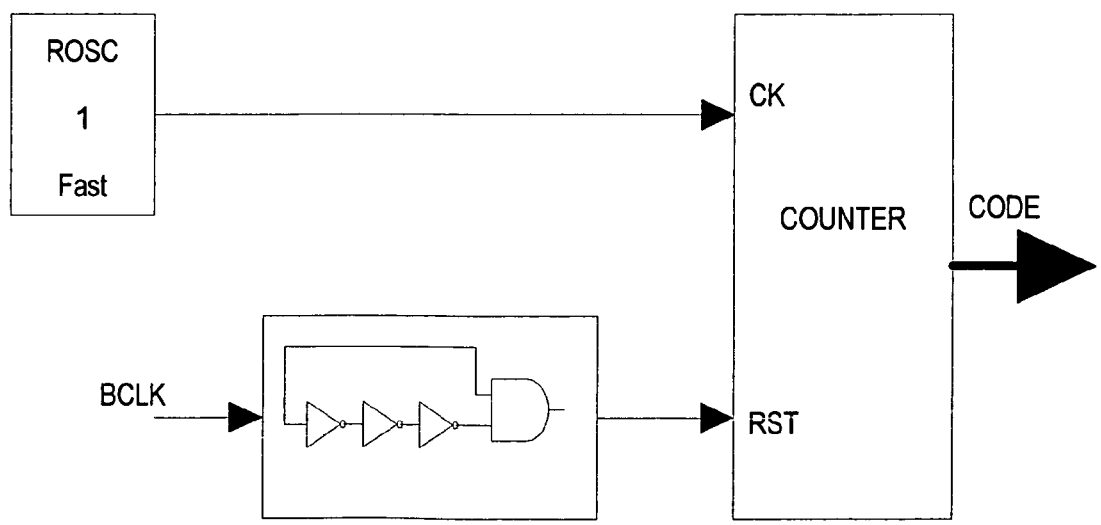
FIG. 10 is a schematic and block diagram of a droop detector of another embodiment that may be used for droop monitoring, for example.

Referring to FIGS. 8, 9, 10 and 11, in operation, the fast ring oscillator ROSC1 is powered by the power supply to be monitored, Vcc in the example of FIG. 8. The slow ring oscillator ROSC2 in FIG. 8 may be implemented in one of three ways: 1) in a low voltage sensitivity configuration in which both gate and RC (resistive-capacitive) circuits are used to implement the oscillator in a well-known manner, 2) in a no (or substantially no) sensitivity configuration by using a fixed bus clock as shown in FIG. 10 or by powering ROSC2 using a separate fixed power supply source such as an analog power supply or bandgap (not shown) that is not susceptible to voltage or temperature variations, or 3) by using a reverse-sensitivity configuration as shown in FIG. 9 and explained in more detail below. The manner in which the slow ring oscillator ROSC2 is implemented is dependent upon a variety of factors including the desired resolution for the circuit.

For the low-voltage-sensitivity and substantially no-voltage-sensitivity configurations described above, ROSC2 in FIG. 8 may be configured in a well-known manner using both gate and RC circuits. For the reverse-sensitivity configuration, referring to FIG. 9, a circuit such as the circuit 900 may be used for one embodiment to provide ROSC2. The circuit 900 includes a ring oscillator 905 that is implemented using only gate circuitry (i.e. no RC circuits) such that its sensitivity to variations in voltage is reversed. The circuit 900 is powered by a voltage $V_{CCR}$ received from a circuit 910.

The circuit 910 includes a p-type bias transistor 915 having a gate coupled to receive a bias voltage provided by a bias generator 920 and one terminal coupled to receive the voltage to be monitored, Vcc in this example. The bias generator 920 may include a voltage divider coupled to receive a substantially fixed voltage from a fixed power supply such as an analog power supply or a bandgap, for example. The circuit 910 further includes enable transistors 925 and 930, transistors 935 and 940 coupled in a current mirror configuration and a resistor R.

The resistance value of R is selected such that VCCR under nominal conditions is lower than Vcc to make the ROSC2 frequency slower than the ROSC1 frequency. The selection is based on the equation: $VCCR=VCC-I_2*R$. For example if VCC=1.2 V and $I_2$ is designed to be 0.5 mA, and the target for VCCR is 0.9V, then R is designed to be 600 ohms. Since $I_2$ and $I_1$ can be designed to be equal, transistors 935 and 940 may be designed to be effectively equivalent. The bias voltage and transistor 915 can then be chosen such that $I_1$ equals, in our example, 0.5 mA. If we choose the bias to be let's say VCC/2, then 915 is sized such that $I_1$ is 0.5 mA.

In operation, as the value of Vcc changes, the gate to source voltage Vgs of the transistor 915 changes causing the current I1 to change. For example, as Vcc increases, Vgs increases causing the current I1 to increase. Due to the current mirror configuration of the transistors 935 and 940, as I1 increases, the current I2 also increases causing the voltage drop across the resistor R to increase. A larger voltage drop across the resistor R results in a lower $V_{CCR}$ to the ring oscillator 905. Because the frequency of the ring oscillator 905 is proportional to the voltage $V_{CCR}$, as $V_{CCR}$ is lowered, so also is the frequency Fout of the output signal from the ring oscillator 905. A decrease in Vcc causes a complementary response by the voltage $V_{CCR}$ and thus, by the frequency Fout of the output signal from the ring oscillator 905.

Thus, as described above, the circuit 900 provides a reverse voltage sensitivity circuit wherein an increase in Vcc causes a decrease in $V_{CCR}$ and thus, a decrease in the frequency of the output signal from the ring oscillator 905.

Figure 11:
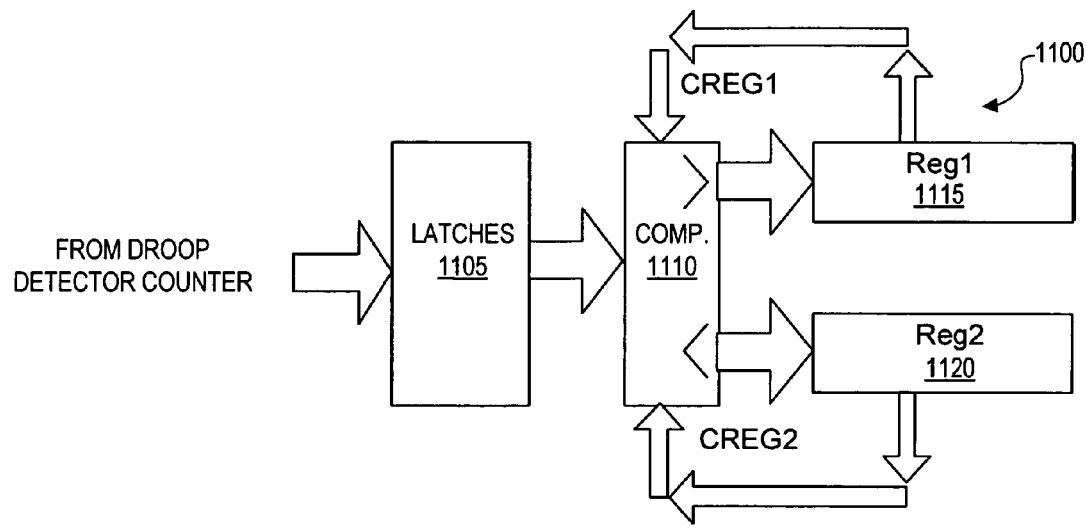
FIG. 11 is a block diagram of a circuit implementation that may be used to track droop history for one embodiment.

With continuing reference to FIGS. 8 and 11, the fast ring oscillator ROSC1 clocks the counter 805 while the slow ring oscillator ROSC2 generates a pulsed, asynchronous reset. The slow ring oscillator basically defines the period of time during which the number of clock pulses from the fast ring oscillator is counted. The number of clock pulses generated between reset pulses varies dependent upon the value of Vcc, the voltage to be monitored, that is used to power ROSC1.

The particular implementation selected for the slow ring oscillator ROSC2 is dependent upon a variety of factors including the desired resolution of the monitoring circuit. For example, where a relatively high resolution is desired, the designer may select a configuration for ROSC2 that provides reverse voltage sensitivity.

With continuing reference to FIGS. 8 and 11, just prior to the reset, the output of the counter 805, which is proportional to the relationship between the frequency of the output signal from the fast ring oscillator ROSC1 and the frequency of the output signal from the slow ring oscillator ROSC2 (or fixed bus clock), is latched by latches 1105 and provided to comparators 1110. The comparators 1110 may operate as described above in reference to FIG. 7 to compare the latched code with values previously stored in droop history registers 1115 and 1120.

For one embodiment, for example, the droop history register 1115 may be initialized to all 1s and the droop history register 1120 may be initialized to all 0s. If the latched code is lower than the value stored in the register 1115 and/or higher than the value stored in the register 1120, then the appropriate register(s) is/are updated to store the new code. In this manner, the droop history registers store codes corresponding to the maximum and minimum values for Vcc during a given time period.

While the circuit of FIGS. 8 and 11 provides an output for every cycle of ROSC2, multiple such circuits can be staggered (not shown) such that an output can be provided for every cycle of a faster clock signal.

Figure 12:
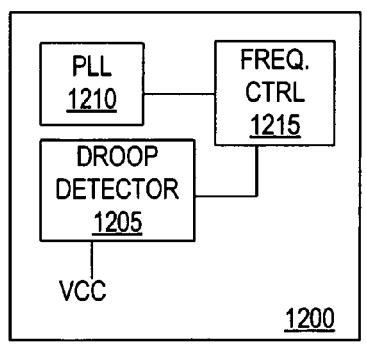
FIG. 12 is a high-level block diagram of an integrated circuit of one embodiment that uses the droop and/or temperature detectors of one embodiment.

FIG. 12 is a high-level block diagram of an integrated circuit 1200 on which one or more droop detectors 1205 of one or more embodiments may be implemented. For the embodiment shown in FIG. 12, a droop detector, such as a droop detector in accordance with one of FIG. 2, 3 or 4 is implemented close to the PLL 1210 such that adaptive frequency control may be provided as described above.

Figure 13:
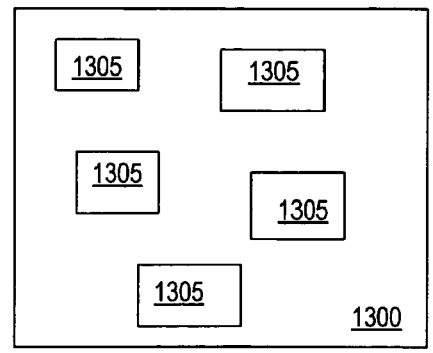
FIG. 13 is a high-level block diagram of an integrated circuit of one embodiment that uses one or more droop monitor circuits of one embodiment.

FIG. 13 is a high-level block diagram of an integrated circuit 1300 of one embodiment on which multiple droop monitor circuits 1305, such as droop monitor circuits in accordance with one or more of FIGS. 7–11 may be implemented. For the embodiment of FIG. 13, the droop monitor circuits 1305 may be implemented at various locations around the integrated circuit 1300 where it is desirable to monitor voltage droop and/or temperature variations for characterization, debugging and/or other purposes.

For one embodiment, for example, droop history registers associated with one or more of the droop monitor circuits are designed to store maximum and minimum voltage and/or temperature values for a given time period. For one embodiment, the droop monitor circuits 1305 are connected in a scan chain configuration. Then, during a testing, characterization or debugging operation, for example, the values stored in the droop history registers may be read out through the scan chain. Other approaches for reading values stored in droop history registers are within the scope of various embodiments.

Figure 14:
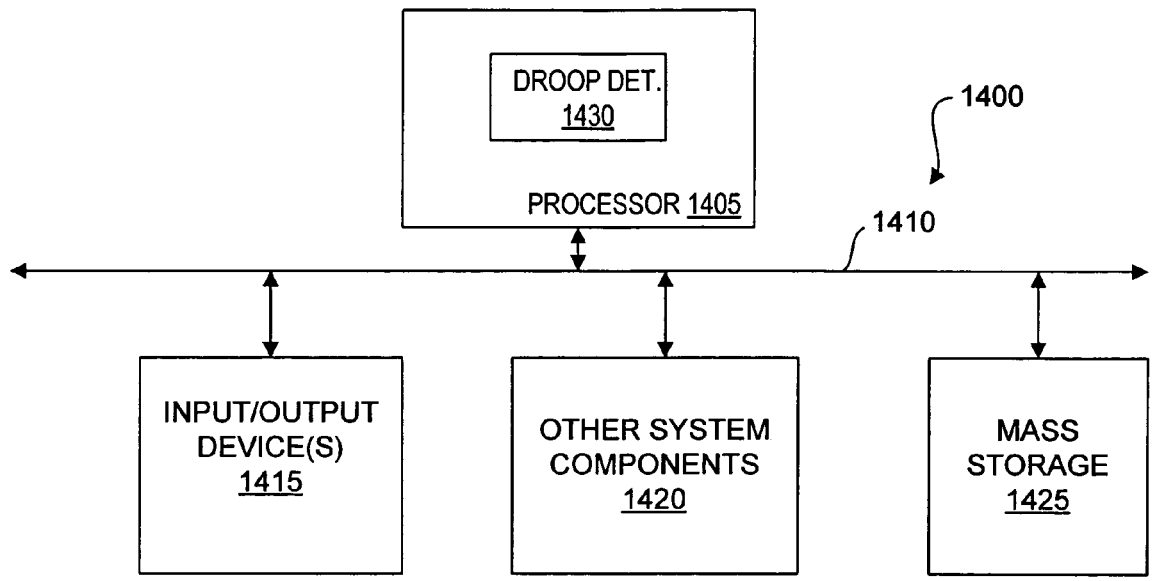
FIG. 14 is a block diagram of a system of one embodiment that uses the droop and/or temperature detectors of one embodiment.

FIG. 14 is a high-level block diagram of a system 1400 of one embodiment including a processor 1405 coupled via a bus 1410 to one or more input/output components 1415, one or more mass storage devices 1425 and one or more other system components 1420. For one embodiment, the processor 1405 includes one or more droop detectors and/or droop monitors 1430 in accordance with one or more embodiments. For some embodiments, one or more droop detectors may be included on a different integrated circuit within the system 1400.

Figure 15:
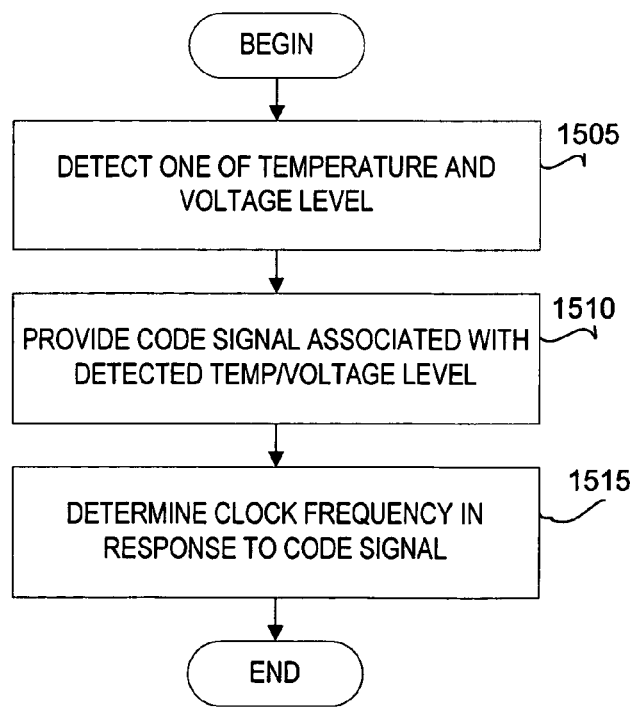
FIG. 15 is a flow diagram showing the method of one embodiment for detecting on-die voltage droop and/or temperature variations.

FIG. 15 is a high-level flow diagram illustrating a method of one embodiment for providing a clock signal. At block 1505, an on-chip detector detects one of a temperature and a voltage level and provides as an output a code signal associated with the detected temperature at block 1510. At block 1515, a control circuit determines a frequency of a clock signal in response to the code signal.

It will be appreciated that, for other embodiments, additional actions may be included.

Thus, a method and apparatus for digitally detecting voltage and temperature variations in a high-frequency clocking system are described. In the foregoing specification, the invention has been described with reference to specific exemplary embodiments thereof. It will be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A computer system comprising:
   a processor including at least a first droop detector coupled to receive a first substantially fixed supply voltage, the first droop detector to detect a level of a second supply voltage and at least a first droop history register having an input coupled to an output of the at least one droop detector, the first droop history register to store data indicating one of a maximum and minimum voltage level detected by the droop detector during a given time period;
   a mass storage device,
   an input device, and
   a bus to communicate information between the processor, the input device and the mass storage device.

2. The computer system of claim 1 wherein the at least first droop detector comprises
   a voltage divider to provide at least first and second substantially fixed reference voltages, and
   at least first and second comparators to compare the second supply voltage with the at least first and second fixed reference voltages.

3. The computer system of claim 2 wherein a clock frequency associated with the computer system is determined based on an output of at least one of the comparators.

4. The computer system of claim 1 wherein the at least first droop detector comprises
   a reference delay path having a reference delay,
   a variable delay path having a first delay that varies in response to the second supply voltage, and
   a phase detector to detect a phase difference between the reference delay and at least the first delay.

5. The computer system of claim 4 wherein a clock frequency associated with the computer system is determined based on an output of the phase detector.

* * * * *